United States Patent [19]

White et al.

[11] 3,888,053

[45] June 10, 1975

[54] METHOD OF SHAPING SEMICONDUCTOR WORKPIECE

[75] Inventors: Joseph Paul White; Paul Joseph Delpriore, both of Somerville, N.J.

[73] Assignee: RCA Corporation, New York, N.Y.

[22] Filed: May 29, 1973

[21] Appl. No.: 364,660

[52] U.S. Cl. .................. 51/281 SF; 51/277; 51/323; 156/297

[51] Int. Cl. .......................... B24b 1/00; B24b 7/22

[58] Field of Search .... 51/277, 323, 281 R, 281 SF, 51/283, 325; 156/297

[56] References Cited

UNITED STATES PATENTS

| | | | |
|---|---|---|---|
| 3,475,867 | 11/1969 | Walsh | 51/277 X |
| 3,571,984 | 3/1971 | Koorneef | 51/277 X |

*Primary Examiner*—Donald G. Kelly
*Attorney, Agent, or Firm*—H. Christoffersen; M. Y. Epstein

[57] ABSTRACT

To accurately mount a number of semiconductor wafers on an accurately dimensioned mounting plate, using a wax adhesive, an unusually high amount of pressure is used to render the wax adhesive films beneath the wafers as thin as possible, and thus of uniform thickness from wafer to wafer. To avoid breakage of the wafers, a slip plate is used between the pressure applying means, which includes a compressible pad, and the wafers, the slip plate allowing lateral expansion of the compressible pad while not imparting lateral stresses to the wafers. The wafers are eventually polished using a polishing pad having a convex surface to provide exceptionally flat wafer surfaces.

3 Claims, 6 Drawing Figures

METHOD OF SHAPING SEMICONDUCTOR WORKPIECE

This invention relates to the fabrication of semiconductor devices, and particularly to the simultaneous shaping, i.e., removal of material, of several semiconductor workpieces to a high degree of accuracy.

The operation of shaping, including the procedures of grinding and polishing, of semiconductor workpieces, e.g., silicon wafers, to provide workpieces of preselected thickness and surface parallelism is well known. Heretofore, however, it has generally been accepted that, in the simultaneous or "batch" processing of several workpieces, the maximum accuracy which can be obtained by such shaping processes is in the order of 5 micrometers. In many instances, however, this degree of accuracy is inadequate for the intended uses of the workpieces, and a need thus exists for means for improving the accuracy obtainable in such "batch" shaping procedures.

Figure 1:
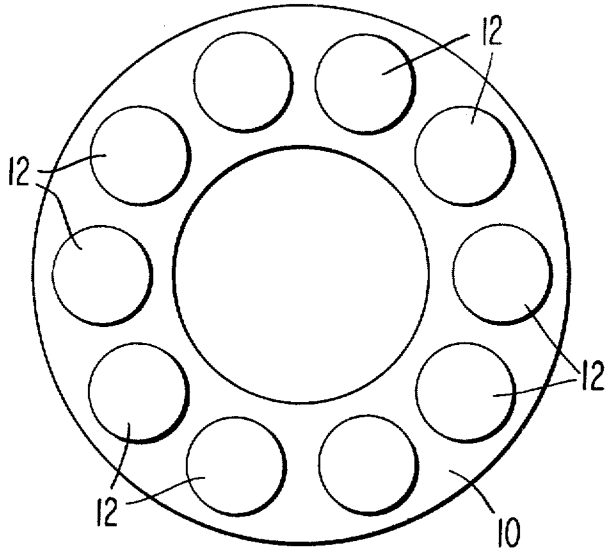
FIG. 1 is a top view of a mounting plate used in accordance with this invention on which the semiconductor workpieces to be shaped are mounted.
Figure 2:
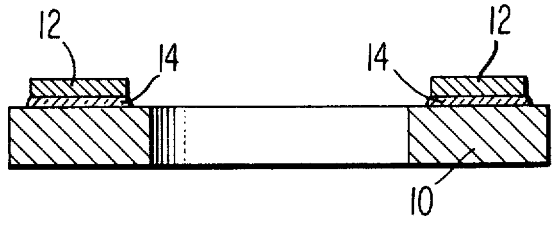
FIG. 2 is a cross-sectional view of the mounting plate and workpieces.

With reference to FIGS. 1 and 2, a workpiece mounting plate 10 is used on which the workpieces 12 are mounted. In this embodiment of the invention, the workpieces 12 comprise disc-like silicon wafers of 2 inches diameter and a thickness of about 20 mils (about 500 micrometers). The wafers 12 can be made by conventional silicon ingot growing and sawing operations, the wafers so provided having a thickness and major surface parallelism tolerance in the order of ± 1.0 mil (25.4 micrometers). In accordance with this invention, the wafers 12 are to be ground and polished to a thickness of 14 mils (350 micrometers) with a thickness and surface parallelism tolerance in the order of ± 0.5 micrometer.

The workpiece mounting plate 10 is used throughout the grinding and polishing operations, and to this end, is dimensioned to a degree of accuracy even greater than that required for the wafers 12, e.g., to a tolerance of ± 5 millionths of an inch (0.125 micrometers).

In this embodiment, the mounting plate 10 is made of hardened and stabilized stainless steel. Stainless steel is selected because it is resistant to the various chemicals used in the cleaning and polishing procedures and it is highly resistant to mechanical damage. The plate 10 is preferably relatively thick (in the order of 1 inch or 2.54 cm.) and ring-shaped. This thickness and shape of the plate 10 are selected to minimize deformation of the plate during the various processing operations while keeping the weight of the plate at a minimum (approximately 12 lbs. or 5.5 kg. for a plate having an outer diameter of 9 inches or 23 cm. and an inner diameter of 4 inches or 10 cm.). The mounting plate 10 is accurately machined and lapped flat and parallel until the required accuracy of dimensions is achieved. With careful handling of the plate 10, the dimensions of the plate can remain within these tolerances for prolonged periods of time and repeated plate usage.

The mounting plate 10 can be made of other machineable and stable metals, such as molybdenum.

Of considerable importance with respect to the accurate grinding and polishing of several workpieces at a time on the mounting plate 10 is the accuracy with which the workpieces are mounted thereon. It is known, for example, to cement workpieces to a mounting plate using a wax adhesive. Heretofore, however, such cementing of workpieces introduced relatively wide dimensional variations in the height of the workpieces above the mounting plate owing to variations in the thickness of the wax films beneath the workpieces.

In accordance with one feature of this invention, substantially complete uniformity of wax film thicknesses from wafer to wafer on the mounting plate 10 is provided. This is achieved by cementing the workpieces to the mounting plate using high temperatures and pressures to increase the flow of wax from under the workpieces, whereby the wax films beneath the workpieces are extremely thin. By providing such thin wax cementing films, in the order of one-half micrometer, the thickness variations of the films from workpiece to workpiece are rendered extremely small, e.g., in the order of 0.25 micrometer. The wax material used is not critical and represents a matter of choice of the various commercial waxes available. For example, a wax designated as No. 4 medium stacking wax available from the Universal Company of Hicksville, N.Y. can be used.

A layer 14 (FIG. 2) of wax having a thickness in the order of 5 mils (125 micrometers) is first applied to the mounting plate 10 by conventional means. For example, the mounting plate 10 is mounted on a hot plate to heat it to the softening temperature of the wax, e.g., around 160°F., and the wax, in the form of a solid stick, is simply rubbed against the heated plate to deposit the wax film. Neither the thickness nor the uniformity of thickness of the wax layer 14 so deposited is critical. While still on the hot plate, a number of workpieces, e.g., 10, are placed, by hand, on the layer 14 in spaced apart relation.

To firmly bond each workpiece 12 to the waxed surface, and to minimize the thickness of the wax films beneath the workpieces 12, as previously described, a substantial amount of pressure is applied to each workpiece.

Of importance is that the pressure used to squeeze the wax from under the silicon wafer workpieces, in the order of 300 psi (21 kg./cm$^2$) is significantly higher than the pressures that it has heretofore been possible to use. The attainment of extremely thin wax cementing films, and the small film thickness variations from workpiece to workpiece, are the direct result of the use of such high mounting pressures. This is achieved as follows.

Figure 3:
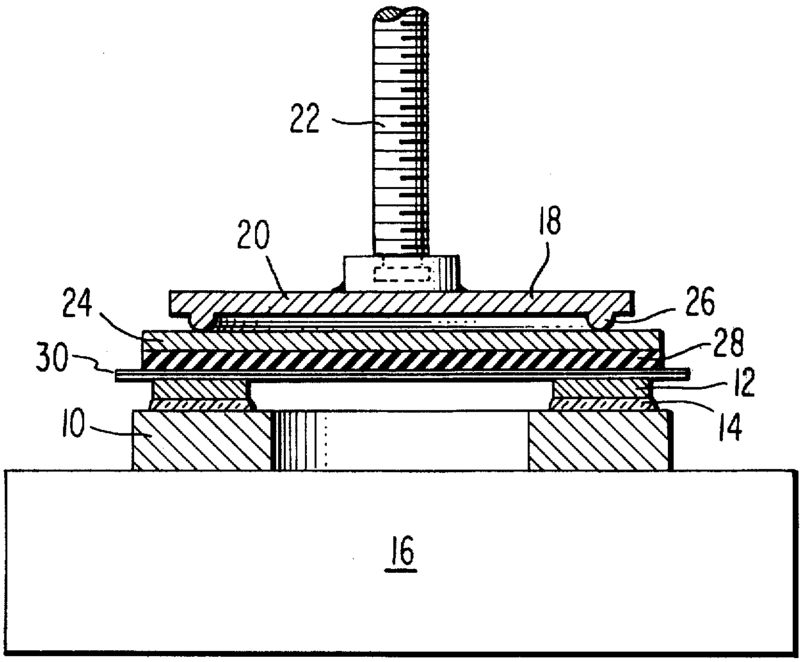
FIG. 3 is a view, in cross-section, of parts of a press used to firmly bond the semiconductor workpieces to the mounting plate.

As shown in FIG. 3, the mounting plate 10 is placed on the bottom plate or anvil 16 of a simple press, the anvil incorporating resistance heating means to maintain the mounting plate 10 and the wax layer 14 thereon at the wax softening temperature, and a uniform compressive pressure is applied to each workpiece 12 through a known pressure assembly 18. The pressure assembly 18 comprises the upper plate 20 of the press, the plate 20 being attached to a pressure screw 22, a pressure equalizing metal plate 24 engaged with the plate 20 by means of an annular rib 26 integral with the plate 20, and a compressible pressure pad 28, such as a silicone rubber pad, disposed between the equalizing plate 24 and the mounting plate 10. The purpose of the two plates 20 and 24 is to apply a uniform pressure across the full surface extent of the plate 24, and the purpose of the compressible pad 28 is to accommodate the variations in thickness of the different workpieces.

Heretofore, in using such pressure assemblies, there was a relatively low upper limit to the pressure which could be applied to the silicon wafers without breaking them. In accordance with this invention, it was discovered that the cause of such breakage is not primarily due to the crushing and compressing effect of the pressure, but rather to a stretching and pulling apart of the wafers by lateral movement of the surface of the compressible pad 28 as it is compressed by the pressure.

To avoid this stretching effect, a lateral stress relief member, or slip plate 30, is disposed between the pressure pad 28 and the wafers, this slip plate 30 having the characteristic of allowing the pressure pad 28 to move laterally while not imparting such lateral movement to the wafers 12.

The slip plate 30 can comprise a laminated structure in which sliding of the lamina with respect to one another can occur. For example, a material such as graphite can be used. A preferred material is a double layer of a low friction material, e.g., various plastic materials such as Teflon, each of the layers thereof sliding easily relative to one another.

As above noted, by applying relatively high compressive pressure against each of the wafers 12, extremely thin wax layers 14, of highly uniform thickness from wafer to wafer, remain. The mounting plate 10 is then removed from the press and allowed to cool.

Having accurately mounted the several wafers 12 on the accurately dimensioned mounting plate 10, the wafers 12 are subjected to generally conventional grinding and polishing processes to reduce the thickness of the wafers 12. Of importance is the fact that once mounted on the mounting plate 10, the wafers 12 are not removed from the plate 10 until the conclusion of the grinding and polishing processes, the mounting plate 10 thus providing an accurate datum plane to which each of the wafers 12 is referenced. Although it is not common to use a single mounting plate 10 throughout the various shaping procedures, modification of known grinding and polishing apparatus to accept the plate 10 with the wafers 12 thereon is within the skill of workers in these arts.

Figure 5:
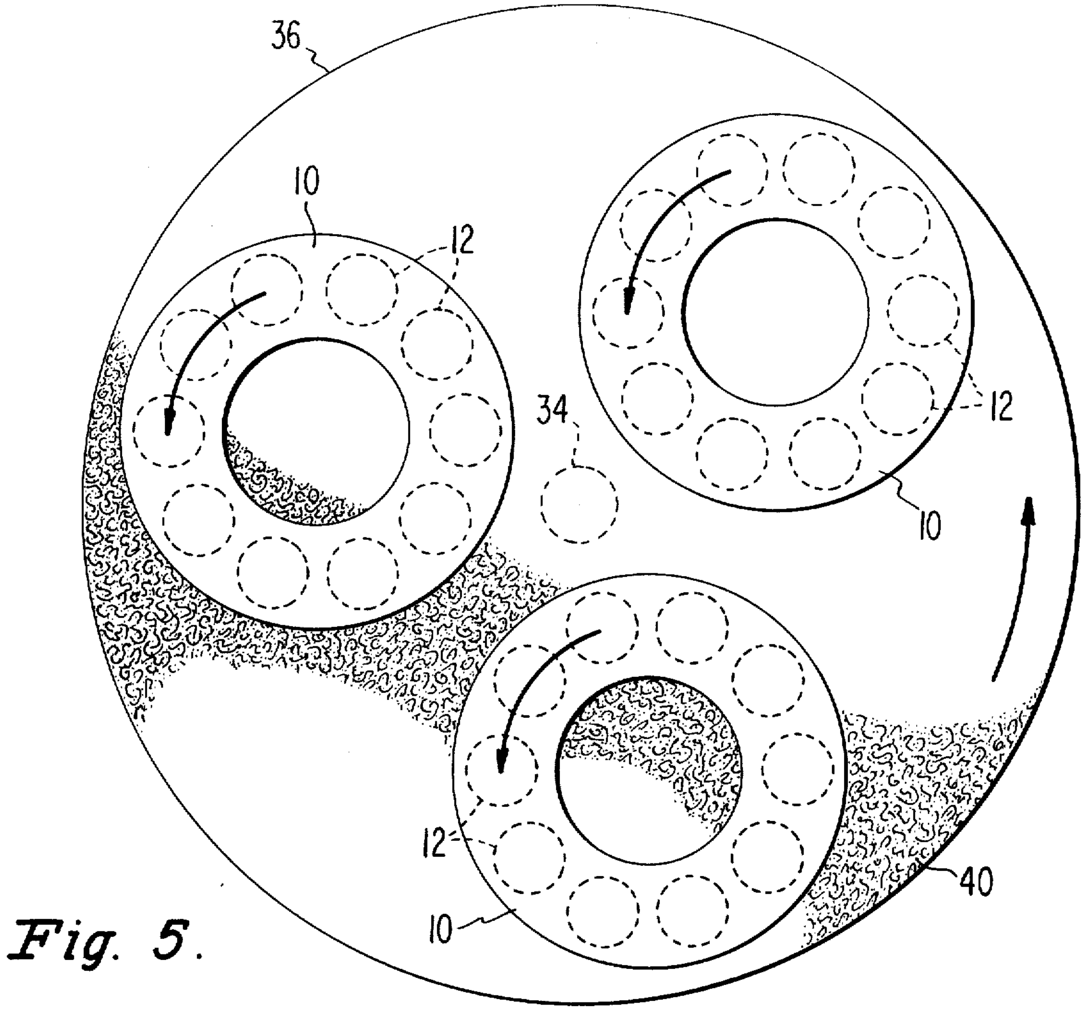
FIG. 5 is a top view of the apparatus shown in FIG. 4.
Figure 4:
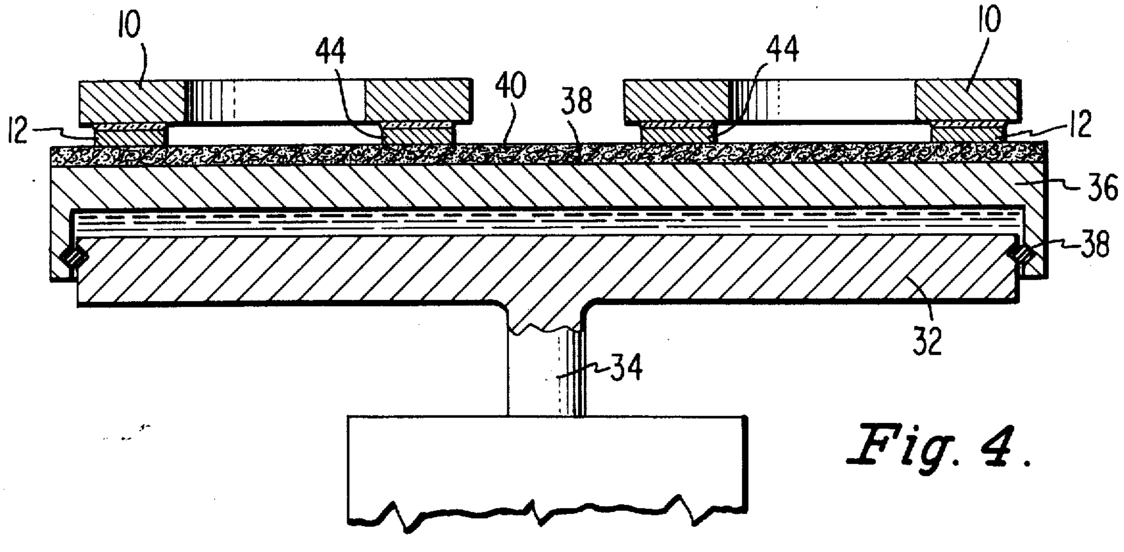
FIG. 4 is a side view, partly broken away, of a portion of a generally conventional apparatus which can be used in the polishing process in accordance with this invention.

With respect to the polishing procedure, one modification of the prior art polishing apparatus is made which is of significance. Thus, as shown in FIGS. 4 and 5, the polishing apparatus, of commercially available type, comprises a circular plate 32 mounted for rotation on a shaft 34. Mounted on the plate 32 is a disc-like member 36 having a dependent flange 37 which fits around the plate 32 in snug water-tight fit therewith, a hollow space thus being provided between the plate 32 and the disc 36. The upper surface 38 of the member 36 is covered with a polishing pad 40 of known type.

In the polishing operation, a number of mounting plates 10 are disposed on the member 36, the major surfaces of the wafers 12 to be polished being in contact with the pad 40. A polishing paste is dispensed onto the pad 40, and the plate 32 is rotated about the shaft 34 axis while each of the mounting plates 10 is rotated, by a known means, not shown, about a central axis perpencidular to the major surfaces thereof. Means, not shown, are also provided for applying a compressive force against the mounting plates 10 to increase the polishing pressure applied to the wafers 12. To prevent excessive heating of the workpieces 12 during the polishing operation, water is circulated through the space provided between the plate 32 and the member 36.

Conventionally, in the use of such polishing apparatus, the surface 38 of the member 36 is rendered as flat as possible. In accordance with this invention, however, it was discovered that better results, with respect to obtaining flat wafer surfaces, can be obtained by making the surface 38 somewhat convex. This is easily accomplished, in apparatus of the type described, by increasing the water pressure within the space between the plate 32 and the member 36, the increased pressure causing a slight doming of the surface 38 of the member and the polishing pad 40 thereon.

Figure 6:
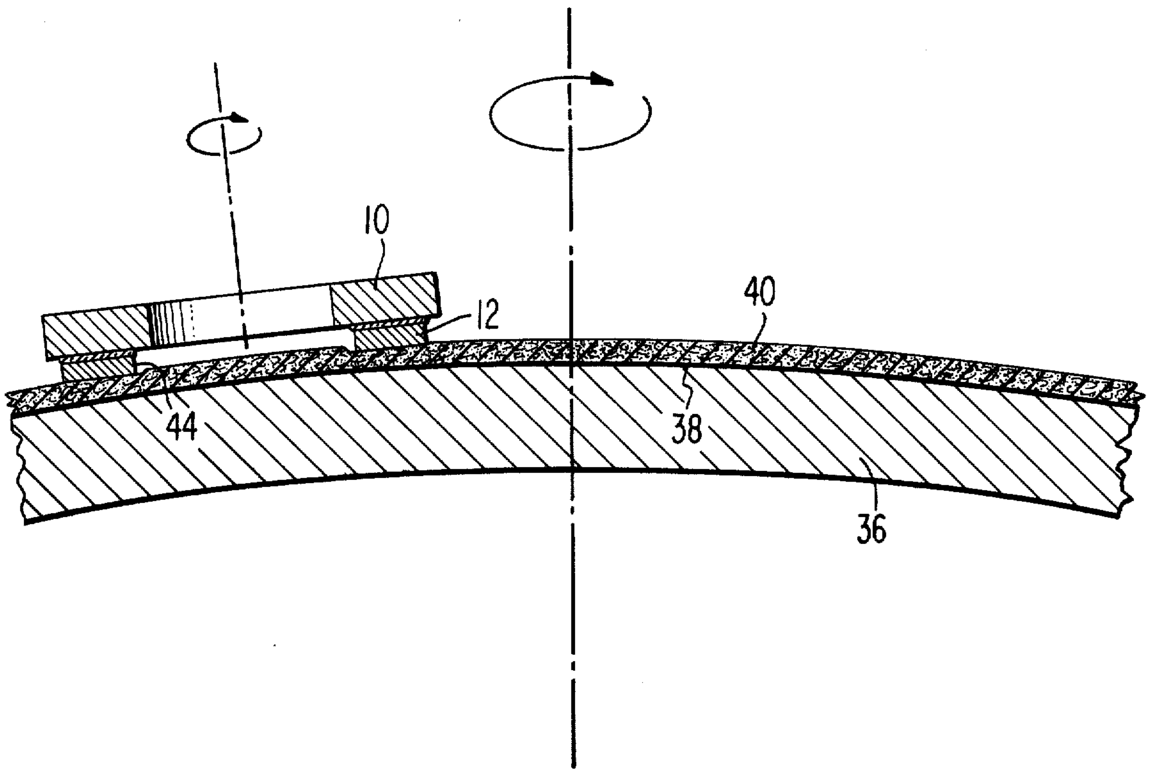
FIG. 6 is a view, similar to that of FIG. 4, but showing the polishing surface modified so as to be convexly domed in accordance with the invention described herein.

While not known for certain, it is believed that owing to the convexity of the surface 38, the pressure between each wafer 12 and the polishing pad 40 is slightly higher at the inside edges 44 of the wafers, with respect to the mounting plates 10, than on the outside. This is illustrated in FIG. 6, wherein, for a convexity of the surface 38 shown greatly exaggerated, the squeezing of the pad 40 by the wafers 12 is greatest at the inside edges 44 of the wafers. The result of this is that, owing to the increased pressure at the inside edges, greater polishing of the wafer surfaces occurs at the inside edges. This, however, is compensated for by the fact that the mounting plates 10 are rotating about the central axis thereof, the tangential velocity of the wafers at the inner edges thereof being less than that at their outer edges. By proper balance of the differential polishing effect caused by the differential pressure across the surface of each wafer with the differential polishing effect caused by the different tangential velocities across the wafer surface, uniform polishing across the surfaces of the wafers is obtained.

For example, with a polishing member 36 having a diameter of 2 feet (about 61 cm.), a plate 32 rotational velocity of 36 rpm, a mounting plate 10 rotational velocity of 10 rpm, and a mounting plate pressure of about 3 psi (about 0.2 kg./cm.$^2$), the surface 38 of the polishing member 36 has a convex radius of curvature in the order of 1000 feet (about 305 meters).

We claim:

1. In a process for shaping semiconductor workpieces, the steps of:

providing a layer of wax adhesive on a surface of a mounting plate and disposing a number of workpieces on said layer, and applying a uniform pressure to each of said workpieces for pressing them into said layer utilizing a compressible pressure applying means to accommodate thickness variations among said workpieces and a slip plate disposed between said compressible pressure applying means and said workpieces for preventing stressing of said workpieces in directions parallel to said layer.

2. A process according to claim 1 wherein the amount of pressure applied in said pressure applying step is such that the said layer beneath said workpieces is reduced to a thickness in the order of 0.5 micrometers.

3. The process of claim 1 in which said slip plate comprises two superimposed sheets of low friction material.

* * * * *